US00RE36735E

United States Patent [19]

Manning

[11] E Patent Number: Re. 36,735

[45] **Reissued Date of Patent: *Jun. 13, 2000**

[54] SELF-ALIGNED LOW RESISTANCE BURIED CONTACT PROCESS

[75] Inventor: Monte Manning, Kuna, Id.

[73] Assignee: Micron Technology Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/613,189

[22] Filed: Mar. 8, 1996

Related U.S. Patent Documents

Reissue of:

[64] Patent No.: 5,292,676
Issued: Mar. 8, 1994
Appl. No.: 07/921,175
Filed: Jul. 29, 1992

[51] Int. Cl.[7] ..... H01L 21/425

[52] U.S. Cl. ..... 438/514; 438/533

[58] Field of Search ..... 437/195, 52, 153–154, 437/158, 162, 40 AS, 41 RLD, 950, 958, 191, 193; 148/DIG. 19–20; 257/903–904, 377, 385, 554, 927; 438/533, 514, 238

[56] References Cited

U.S. PATENT DOCUMENTS 4,231,811 11/1980 Somekh et al. .
4,573,257 3/1986 Hulseweh .
4,966,865 10/1990 Welch et al. .
5,064,776 11/1991 Roberts .
5,147,814 9/1992 Takeuchi .
5,187,122 2/1993 Bonis .
5,266,523 11/1993 Manning .

FOREIGN PATENT DOCUMENTS 57-128067 9/1982 Japan .
2-54935 2/1990 Japan .

OTHER PUBLICATIONS

S. Wolf, Silicon Processing for the VLSI Era—vol. II, pp. 544–545 (Lattice Press 1990).

*Primary Examiner*—Jey Tsai
*Attorney, Agent, or Firm*—Trask, Britt & Rossa

[57] ABSTRACT

A buried contact is formed in a substrate implantation of phosphorous or arsenic through a window cut into the insulating silicon oxide layer and a superimposed thin silicon layer. The photoresist used to etch the window is cut back a limited amount prior to implantation. The peripheral margin of the buried contact implanted through the exposed part of the thin layer of silicon lowers the threshold voltage of any parasitic MOS device which may be created between the buried contact and the remote N+source or drain structure.

10 Claims, 3 Drawing Sheets

SELF-ALIGNED LOW RESISTANCE BURIED CONTACT PROCESS

Matter enclosed in heavy brackets [ ] appears in the original patent but forms no part of this reissue specification; matter printed in italics indicates the additions made by reissue.

FIELD OF THE INVENTION

This invention relates to semi-conductor integrated circuits, and more specifically to the creation of reliable buried contacts between a transistor element and a remote diffusion area. The invention has particular applicability to the fabrication of integrated memory circuits.

BACKGROUND OF THE INVENTION

Buried contacts are used in the fabrication of integrated circuits in order to establish current pathways through the underlying substrate rather than on the top surface of the circuit. Buried contacts ensure electrical isolation from other parts of the circuit, and leave the top surface free for use in establishing other connections and outside contacts giving access to the circuit.

For instance, in the fabrication of Static Random Access Memories (SRAMs), a buried contact is used to link the gate of one transistor to the drain of another in a paired transistor memory cell, as explained in U.S. Pat. No. 5,064,776 Roberts.

In the fabrication of Dynamic Random Access Memories (DRAMs), a buried contact is used between a storage capacitor and the source or drain of its controlling transistor.

Integrated circuit designers are forever trying to improve the conductive quality of buried contacts under the constraint of ever-increasing circuit complexity and demand for miniaturization.

A buried contact must retain a low resistive path minimal current leakage to other parts of the circuit, and reduce the volume.

Buried contacts are typically created by diffusion or implantation of ions in the upper region of the circuit substrate through an opening in an insulating silicon oxide layer laid over the upper surface of the substrate.

The diffusion or implantation of the buried contact must extend beyond the periphery of the window open near or under a gate or storage capacitor structure in order to reach the source or drain region to which the gate or capacitor must be connected. Insufficient diffusion or implantation leaving too large a spacing between the edge of the buried contact and the outer edge of the polysilicon defining the source or drain may result in the creation of a parasitic MOS device having a relatively high threshold voltage (Vt) between the buried contact and the remote source or drain location. This parasitic MOS device may increase the buried contact resistance and degrade the circuit performance. The diffusion of the buried contact into the substrate is usually controlled by the size of the window, the type and duration of the diffusion or implantation process, and the judicious selection of doping elements.

Various techniques based on successive diffusion or punch-through implantations which have been used in the past require multiple masking steps which increase the fabrication complexity, processing time and cost.

SUMMARY OF THE INVENTION

The principal and secondary objects of this invention are to provide a reliable technique for diffusing buried contacts through a relatively small window while avoiding the formation of parasitic MOS devices between the buried contact and the remote source or drain diffusion area; and to do so with a limited number of masking steps.

These and other objects are achieved by the buried contact by the creation of phosphorous or arsenic implantation through a relatively narrow window cut in the insulating silicon oxide layer and a thin layer of silicon laid over it. The edge of the photoresist used to etch the window are descumed back a small amount in order to allow implantation of a marginal zone through the exposed section of the silicon layer.

DESCRIPTION OF THE PREFERRED EMBODIMENTS OF THE INVENTION

Figure 1:
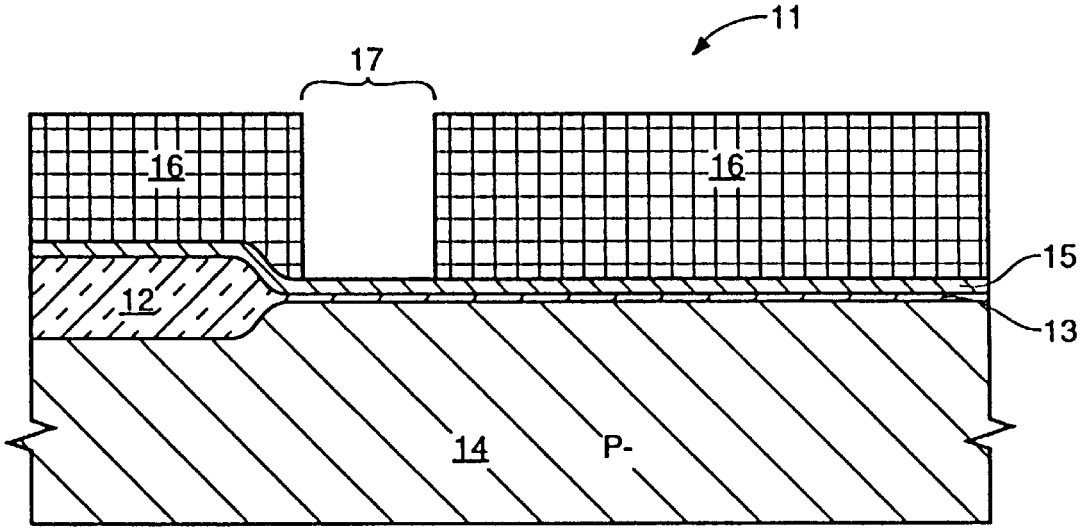
FIG. 1 is a cross-sectional view of the initial layer deposition process.

Referring now to the drawing, the invention will be described in connection with the fabrication of a DRAM die.

FIG. 1 illustrates a section 11 of an integrated circuit including the end section 12 of a dogbone-shaped wafer formed by a lateral bulge in the silicon oxide layer 13 grown over a P-doped substrate 14. The end section 12 is to be used in forming a storage capacitor to be linked by a buried contact to a remote N+diffused area associated with the source or drain of a controlling transistor. A thin first layer 15 of polysilicon may first be deposited over the insulating oxide layer 13. The wafer is then covered with a photoresist 16. The photoresist is exposed through a mask, then developed to create a void 17 over the area where the buried contact is to be formed.

Figure 2:
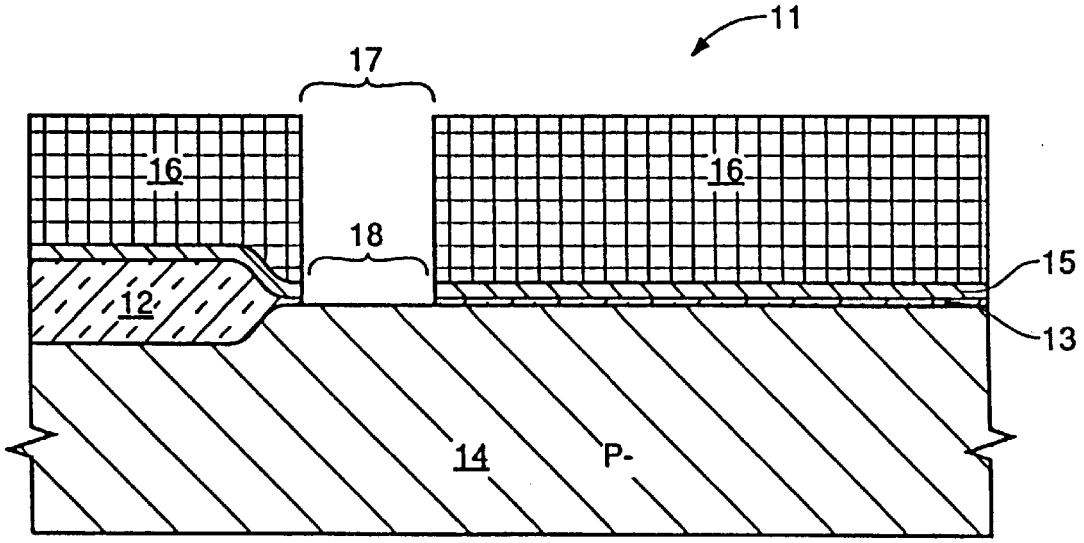
FIG. 2 is a cross-sectional view of the buried contact window etching.
Figure 3:
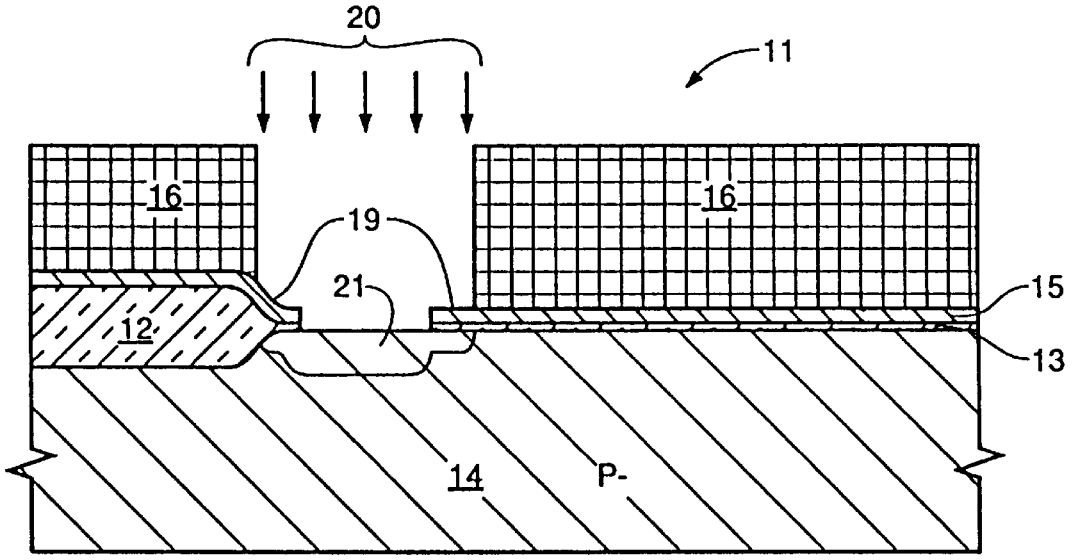
FIG. 3 is a cross-sectional view of the buried contact window enlargement, and implantation processes.

As shown in FIG. 2, the void is used to etch a window 18 through the thin polysilicon layer 15 and the oxide layer 13. The periphery of the void 17 in the photoresist 16 is descumed or cut back to expose a peripheral margin 19 of polysilicon around the window 18 as illustrated in FIG. 3. Phosphorous or arsenic is then implanted as indicated by the arrows 20 by a punch-through implant process or other appropriate technique creating a N+doped zone 21 that extends under the entire descumed width of the photoresist.

Figure 4:
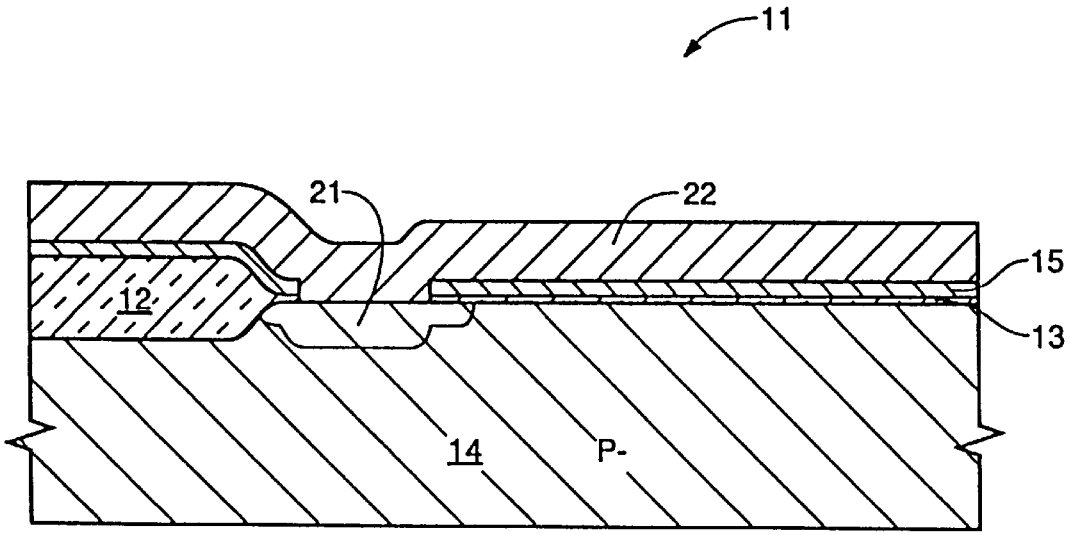
FIG. 4 is a cross-sectional view of the polysilicon layering.

As shown in FIG. 4, a second layer 22 of polysilicon is deposited then doped and patterned to create the storage capacitor plate, and the source, gate and drain of the transistor.

Figure 5:
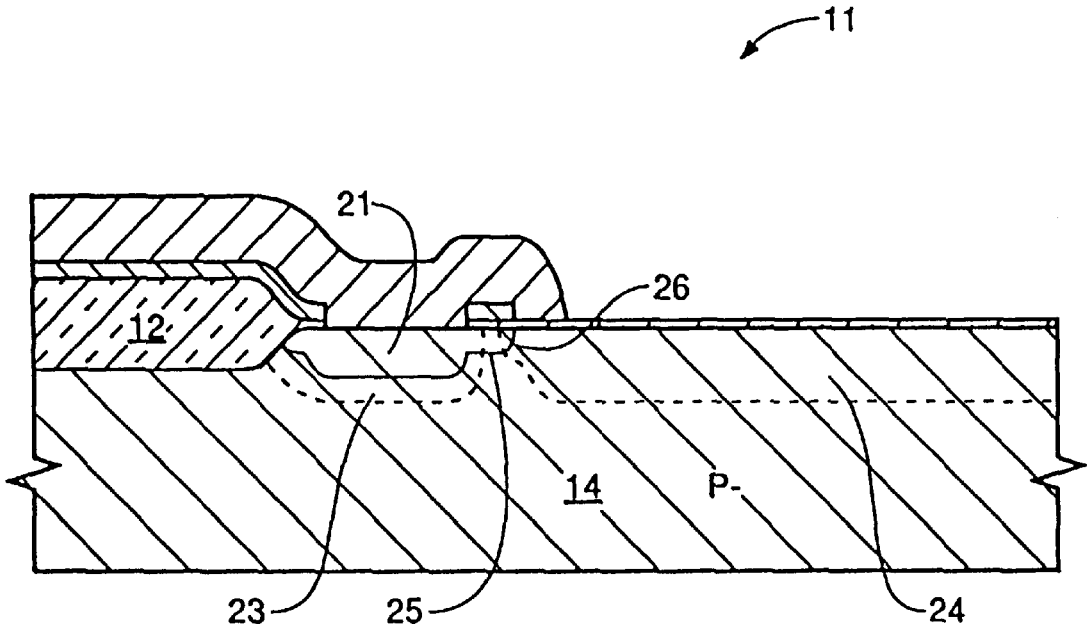
FIG. 5 is a cross-sectional view of the final buried contact structure.

FIG. 5 illustrates the buried contact 23 after its diffusion and the diffusion 24 of the transistor source or drain area. It should be noted that any parasitic MOS device which may have been created between the buried contact 23 and the source or drain zone 24 is bridged by the peripheral area 26 of the phosphorous or arsenic implant. This extension of the implant greatly reduces the threshold voltage of the parasitic MOS device. Typically, a 0.2 micrometer etch back of the photoresist around the buried contact opening will be adequate in order to create a low threshold MOS device zone bridging arsenic-doped diffusions of the buried contact and source/drain structure. The window enlargement process may be used without depositing the first layer 15 of polysilicon.

It should be noted that the above-described process can be used in connection with other types of buried contacts such as those in use in connecting the gate of one transistor to the drain of another in a SRAM circuit.

While the preferred embodiments of the invention have been described, modifications can be made and other embodiments may be devised without departing from the spirit of the invention and the scope of the appended claims.

What is claimed is:

1. A process for forming a buried contact between a transistor element at the surface of a substrate and a remote diffusion region which comprises the steps of:

growing an insulation layer of silicon oxide over said surface;

depositing a first layer of polysilicon over said insulation layer;

depositing a photoresist over said first polysilicon layer;

patterning a window in said photoresist;

etching said first polysilicon layer and oxide layer through said window;

descuming the edges of said photoresist window to expose a peripheral width of said first polysilicon layer;

implanting a doping element into said substrate through said descumed window and peripheral width to form a central zone of buried contact aligned with said window and a peripheral zone of buried contact substantially aligned with said peripheral width, wherein said peripheral width receives a lesser amount of doping element than said central zone;

removing said photoresist after said implanting;

depositing a second layer of polysilicon over said first layer; and patterning said second layer to form the source, drain and other parts of said transistor, and access to said buried contact.

2. The process of claim 1, wherein the step of implanting comprises implanting into said substrate a doping element selected from a group consisting of arsenic and phosphorous.

*3. A process for forming a buried contact between a transistor element at the surface of a substrate and a remote diffusion region which comprises the steps of:*

*growing an insulation layer of silicon oxide over said surface;*

*depositing a first layer of polysilicon over said insulation layer;*

*selectively forming an etch resist over said first polysilicon layer to define a window;*

*etching said first polysilicon layer and oxide layer exposed by said window;*

*exposing a peripheral width of said first polysilicon layer adjacent said window;*

*implanting a doping element into said substrate through said window and peripheral width to form a central zone of buried contact aligned with said window and a peripheral zone of buried contact substantially aligned with said peripheral width, wherein said peripheral zone receives a lesser amount of doping element than said central zone;*

*removing said etch resist after said implanting;*

*depositing a second layer of polysilicon over said first layer; and*

*patterning said second layer to form the source, drain and other parts of said transistor, and access to said buried contact.*

*4. The process of claim 3, wherein the step of implanting comprises implanting into said substrate a doping element selected from a group consisting of arsenic and phosphorous.*

*5. A process for forming a buried contact between a transistor element at the surface of a substrate and a remote diffusion region which comprises the steps of:*

*growing an insulation layer of silicon oxide over said surface;*

*depositing a first layer of polysilicon over said insulation layer;*

*selectively forming a resist over said first polysilicon layer to define a window;*

*removing said first polysilicon layer and oxide layer exposed by said window;*

*exposing a peripheral width of said first polysilicon layer adjacent said window;*

*implanting a doping element into said substrate through said window and peripheral width to form a central zone of buried contact aligned with said window and a peripheral zone of buried contact substantially aligned with said peripheral width, wherein said peripheral zone receives a lesser amount of doping element than said central zone;*

*removing said resist after said implanting;*

*forming a selectively patterned second layer of polysilicon over said first layer to form source, drain and other parts of said transistor, and access to said buried contact.*

*6. The process of claim 5, wherein the step of implanting comprises implanting into said substrate a doping element selected from a group consisting of arsenic and phosphorous.*

*7. A process for forming a buried contact between a transistor element at the surface of a substrate and a remote diffusion region which comprises the steps of:*

*forming an insulation layer over said surface;*

*depositing a polysilicon layer over said insulation layer;*

*selectively defining a window on said polysilicon layer;*

*removing said polysilicon layer and underlying insulation layer exposed by said window;*

*defining a peripheral width of said polysilicon layer adjacent said window;*

*implanting a doping element into said substrate through said window and peripheral width to form a central zone of buried contact aligned with said window and a peripheral zone of buried contact substantially aligned with said peripheral width, wherein said peripheral zone receives a lesser amount of doping element than said central zone; and*

*forming a selectively patterned conductive layer over said polysilicon layer to form source, drain and other parts of said transistor, and access to said buried contact.*

*8. The process of claim 7, wherein the step of implanting comprises implanting into said substrate a doping element selected from a group consisting of arsenic and phosphorous.*

*9. A process for forming a buried contact between a transistor element at the surface of a substrate and a remote diffusion region which comprises the steps of:*

*forming an insulation layer over said surface;*

*depositing a polysilicon layer over said insulation layer;*

*selectively removing said polysilicon layer and underlying insulation layer to expose said substrate through a window;*

*defining a peripheral width of said polysilicon layer adjacent said window for implantation of a doping element therethrough;*

*implanting said doping element into said substrate through said window and peripheral width to form a central zone of buried contact aligned with said window and a peripheral zone of buried contact substantially aligned with said peripheral width, wherein said peripheral zone receives a lesser amount of doping element than said central zone; and*

*forming a selectively patterned conductive layer over said polysilicon layer to form parts of said transistor, and access to said buried contact.*

*10. The process of claim 9, wherein the step of implanting comprises implanting into said substrate a doping element selected from a group consisting of arsenic and phosphorous.*

* * * * *